United States Patent [19]

Stadler et al.

[11] Patent Number: 5,236,548

[45] Date of Patent: Aug. 17, 1993

[54] MAGAZINE FOR HOLDING DISK-TYPE WORKPIECES IN PARTICULAR SEMICONDUCTOR WAFERS DURING WET-CHEMICAL SURFACE TREATMENT IN LIQUID BATHS

[75] Inventors: Maximilian Stadler, Haiming; Schwab Gunter, Burgkirchen; Peter Romeder, Burghausen, all of Fed. Rep. of Germany

[73] Assignee: Wacker-Chemitronic Gesellschaft Fur Elektronik-Grundstoffe mbH, Munich, Fed. Rep. of Germany

[21] Appl. No.: 823,289

[22] Filed: Jan. 21, 1992

[30] Foreign Application Priority Data

Feb. 1, 1991 [DE] Fed. Rep. of Germany ....... 4103084

[51] Int. Cl.$^5$ .................... H01L 21/306; B44C 1/22; C03C 15/00
[52] U.S. Cl. .................. 156/639; 156/654; 156/657; 156/662; 156/345; 134/33
[58] Field of Search ............... 156/637, 638, 639, 654, 156/657, 662, 345; 134/32, 33, 34, 119, 121, 137; 269/47, 55

[56] References Cited

U.S. PATENT DOCUMENTS

| 3,679,517 | 7/1972 | Schulten et al. | 156/345 |
| 3,727,620 | 4/1973 | Orr | 156/345 X |
| 3,808,065 | 4/1974 | Harvey et al. | 156/345 |
| 3,977,926 | 8/1976 | Johnson et al. | 156/345 X |

FOREIGN PATENT DOCUMENTS

| 53-39872 | 4/1978 | Japan | 156/637 |
| 54-37581 | 3/1979 | Japan | 156/639 |

*Primary Examiner*—William A. Powell
*Attorney, Agent, or Firm*—Burgess, Ryan and Wayne

[57] ABSTRACT

A magazine is provided for holding disk-type workpieces, in particular semiconductor wafers, in the wet-chemical surface treatment in liquid baths. The magazine is particularly useful for etching semiconductor wafers in a liquid bath, which contains an insert (5) which has a diameter of 1.1–1.9 times the diameter of the wafer (6) and which has arrangements of guide strut assemblies (12) held parallel at a spacing of at least twice the wafer thickness by spacing struts (8). The guide strut assemblies (12) comprise main guide struts (9) and subsidiary guide struts (10) which diverge at the linking points (13), which do not lie on the housing axis, in not more than three directions. This etching magazine makes possible a marked reduction in the deterioration in the wafer geometry normally observed in etching treatments.

12 Claims, 2 Drawing Sheets

MAGAZINE FOR HOLDING DISK-TYPE WORKPIECES IN PARTICULAR SEMICONDUCTOR WAFERS DURING WET-CHEMICAL SURFACE TREATMENT IN LIQUID BATHS

BACKGROUND OF THE INVENTION

1) Field of the Invention

The invention relates to a magazine for holding disk-type objects, in particular semiconductor wafers, during wet-chemical surface treatment in liquid baths, comprising a housing provided with openings for inlet and outlet of the bath liquid and means for introducing it into a liquid bath, and an insert which can be introduced into the housing for holding the workpieces to be treated directly, closely and flatly opposite one another.

2) Background Art

It is known that disk-type substrates, in particular single-crystal and polycrystalline semiconductor substrates composed, for example, of silicon, germanium and compound semiconductors such as gallium arsenide and indium phosphide or oxidic materials such as quartz, rubin, spinel or garnet, such as are generally produced by sawing up rod-type workpieces, are subjected, during the production process and, in particular, before further processing, to produce electronic devices, to many different kinds of cleaning and etching treatments which may serve, for example, to remove destroyed crystal regions from surface, or even to chemically alter the surface, in particular for instance by oxidation, oxide layer removal or hydrophilization.

It is important in such treatment steps that the cleaning solutions and etching solutions are distributed during the reaction uniformly and homogeneously over the entire surface of the wafers. At the same time, the cleaning and etching operations should also proceed at essentially the same rate over the entire wafer surface, so that, for example, nonuniform etching depths are avoided. Only in this way is it possible to obtain, for example, clean surfaces with as little flatness variation as possible and high surface parallelism, as are required by the manufacturers of electronic devices for the semiconductor wafers used.

In order to achieve such a uniform treatment of the surfaces with the cleaning solutions and etching solutions, a wide variety of devices have already been disclosed in the prior art such as, for instance, in DE-A-3-306 331 and DD-A-220 859. Thus, one of the design variations described therein is that the substrate to be etched is held at one surface with a suction head while a thorough mixing of the solution is achieved opposite the other surface which is to be etched, by rotating wafers which are provided with flow channels. In this case, however, only the processing of one wafer surface is possible.

In order however, to be able to process both surfaces, DD-A-220 859 provides an arrangement in which the wafers are held in an etching basket similar to a cage approximately parallel to one another and in a freely mobile fashion, so that a movement of the wafers to be etched relative to the etching basket is possible. In this case, the rotation of the etching basket results in a thorough mixing of the solution and simultaneously in a movement of the wafer relative to the etching basket, as a result of which the points of support of the wafer on the rods of the etching basket are continuously altered. However, in order to increase the thorough mixing of the treatment liquid, this embodiment requires the addition of smooth but not circularly shaped spacing disks which are also freely mobile and which also move relative to the etching basket and to the wafers to be processed. Under these conditions, however, the danger of mechanical damage to the wafers, of contamination by the material of the spacing disks or of the etching basket, or of a nonuniform application of the etching liquid if the spacing disks rest directly on the wafer surface of the wafer to be processed, is appreciably increased at the same time.

If, as is disclosed by DE-A-3 306 331, the treatment liquid is thoroughly mixed only by the wafers themselves or by the holding rods at the edge of the wafers, a more intense thorough mixing and greater removal rate, which results in lens-shaped cross section of the wafers, are produced in this edge region. Ring-shaped thickened sections which are produced by more intense removal at the wafer edge or in the interior of the wafer are also often observed.

Ultimately, therefore, the conventional etching processes are associated with a deterioration in the wafer geometry during the production of semiconductor wafers, in particular, as a result of the unfavorable wafer holding device. This disadvantage intensifies with increasing diameter of the substrates and makes itself felt, in particular, at diameters of >100 mm, such as are increasingly required in device production.

The object of the invention is therefore to provide a holding device for treating wafers in liquid baths, with which a double-sided, uniform treatment with the bath liquid is possible without inhomogeneous reaction patterns occurring. In particular, the deterioration in quality during etching processes should be kept as low as possible so that the production of wafers with extremely flat and plane-parallel surfaces is possible.

SUMMARY OF THE INVENTION

This object is achieved by an insert which has a) parallel arrangements of guide strut assemblies 12 comprising at least two guide struts 7 in one plane, and b) at least three spacing struts 8 which are arranged so as to precisely fit the inside surface of the housing cylinder and which fix at least three of the planes of the guide strut assemblies at the outer end, facing the housing, of the guide struts flatly opposite one another so that the gaps between the planes of the guide struts permit the reception of the disk-type workpieces to be etched, at least one main guide strut 9 connecting two spacing struts and at least one subsidiary guide strut 10 connecting a guide strut to a spacing strut and the majority of the guide struts being folded or bent, c) the guide struts diverging at the linking points 13 in not more than three directions, d) the linking points of the guide struts not lying on the longitudinal axis of the cylindrical housing, e) the diameter of the insert corresponding to 1.1 to 1.9 times the diameter of the disk-type workpieces held, f) the length of the secant to the circumscribing circular arc between at least two of the spacing struts being greater than or equal to the diameter of the disk-type workpieces to be held and the length of the secant to the circumscribing circular arc between at least two of the spacing struts being smaller than the radius of the objects to be held, g) the inner clear distance between two guide strut planes for holding the disk-type workpieces corresponding to at least twice their thickness.

BRIEF DESCRIPTION OF THE DRAWINGS

The invention is explained below in greater detail with reference to the exemplary embodiment shown in FIGS. 1 and 2. In the figures.

DESCRIPTION OF THE PREFERRED EMBODIMENTS

Figure 1:
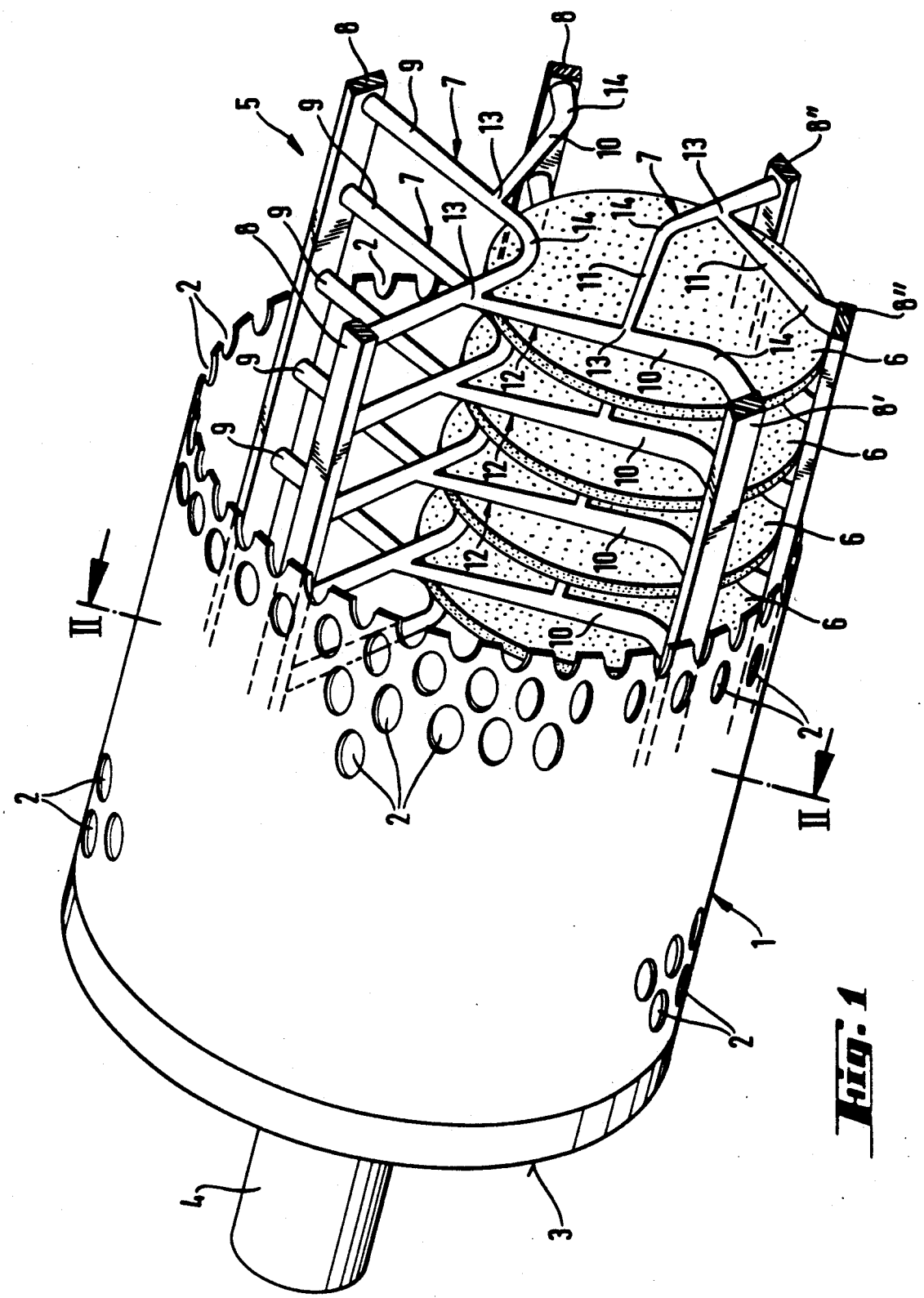
FIG. 1 shows in a perspective partial representation a possible embodiment of an etching magazine according to the invention comprising insert and housing.

The magazine shown in FIG. 1 advantageously serves to hold, introduce and agitate disk-type workpieces such as, for instance, extremely clean semiconductor wafers, in particular silicon wafers, into baths which contain, in particular, etching solutions. The magazine comprises a preferably cylindrical housing 1 having passage openings 2 for the passage of liquid, and an end-face closure lid 3 with means 4, for example a spindle, for introducing it into a liquid bath, and also an insert 5 for holding the disk-type workpieces 6 directly closely and flatly opposite one another in the housing 1 approximately perpendicular to the axis of the housing cylinder.

The disk-type workpieces 6 treated are in particular round wafers. It is also possible to treat approximately round wafers partially truncated at the periphery. Such wafers, in some cases also multiply truncated at the periphery, are common in semiconductor technology in order to indicate degree of doping and crystal orientation. The process also does not exclude, however, the processing of other wafer shapes, for example only partially round, oval polygonal wafers.

The insert 5 is made up of guide struts 7 and spacing struts 8, which are connected to the ends of the guide struts, and in particular, in a preferred embodiment, in such a way that they are all arranged equidistant from the axis of the housing cylinder on the cylinder casing. A housing diameter of 1.1-1.9 times the wafer diameter has provided beneficial.

Figure 2:
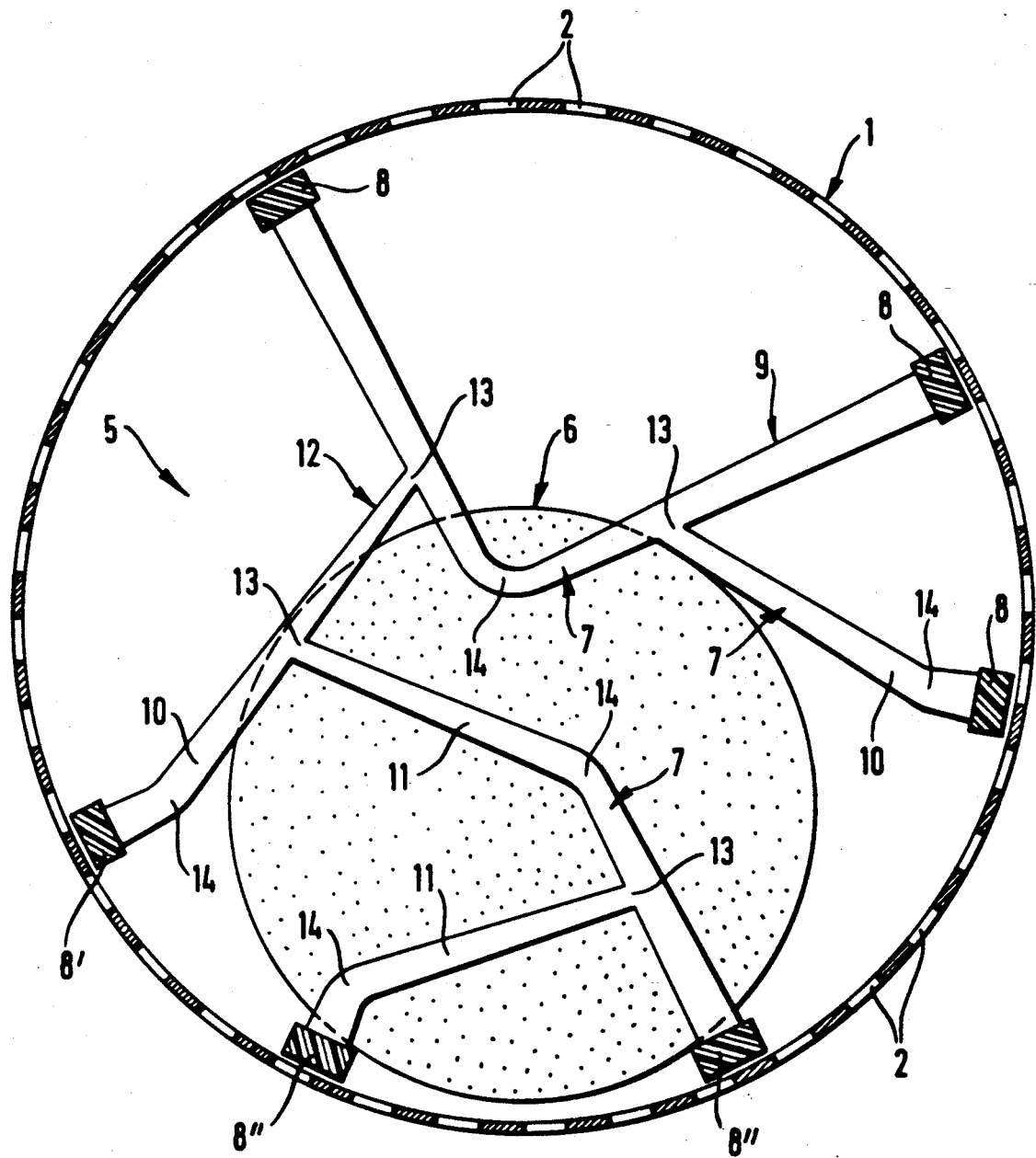
FIG. 2 shows a cross section in the plane II—II of the insert shown in FIG. 1.

FIG. 2 shows a cross section of a preferred embodiment of the insert 5, in which at least one main guide strut 9 connects two spacing struts 8. However, embodiments having two or more main guide struts, are also conceivable. At least one subsidiary guide strut 10 connects the main guide strut 9 to a further spacing strut 8'. In accordance with the tree principle, further subsidiary guide struts 11 may also run from each subsidiary guide strut 10 to spacing struts 8". The sum of the main and subsidiary guide struts situated in one plane and serving to guide a wafer surface on one side is referred to below as a guide strut assembly 12.

Although the number of subsidiary guide struts and main guide struts which are connected to the linking points 13 is just like the number of spacing struts, not in principle subject to an upper limit, it should, however, expediently be kept as low as possible in order to reduce the number of contact points with the wafer surfaces. At a minimum one main guide strut and one subsidiary guide strut are necessary. Similar ends of the guide struts are joined by a spacing strut, so that in the embodiment having one main guide strut and one subsidiary guide strut, three spacing struts are necessary.

In a preferred embodiment, there are a main guide strut, two subsidiary guide struts which connect the main guide struts to spacing struts, and two subsidiary guide struts which connect other subsidiary guide struts to spacing struts. As a rule, the number of spacing struts is equal to the sum of the numbers of main guide struts and of subsidiary guide struts plus 1, and in this preferred exemplary embodiment, there are therefore six spacing struts.

In order to prevent the disk-type workpieces falling out of the insert 5 when it is introduced into the housing 1, at least two of the spacing struts 8 are expediently so arranged that their spacing is less than the wafer diameter and preferably corresponds to about the wafer radius. This is important, in particular, in the case of inserts having few spacing struts, for instance 3. Advantageously, in particular when there are many spacing struts, for example 5-10, at least one of the gaps between two spacing struts is chosen so large that it is possible to introduce the wafer, i.e. larger than the diameter of round disk-type bodies or larger than the smallest width of truncated wafers or wafers having a different peripheral shape., In the preferred exemplary embodiment of FIG. 2, there are four gaps which are smaller than the wafer diameter and two which are larger.

The insert is preferably so dimensioned that it can be pushed into the housing 1 so as to fit precisely, i.e., with the smallest possible tolerance, and only a certain play, but movement of the insert relative to the housing is not possible. The distance of the spacing struts 8 from the axis of the housing cylinder 1 is therefore expediently chosen only slightly smaller than the radius of the housing, i.e., as a rule, up to 4 mm smaller. The insert can then be pushed flush into the housing, the spacing struts serving to support the insert 5 in the housing 1. In preferred embodiments, the insert can be held in position by guides in the housing, for instance guide studs.

The spacing struts connect a number of guide strut assemblies 12 which basically depend on the number of disk-type workpieces 6 to be treated and can be as large as desired, preferably 10-20, in a flat and parallel manner and at a constant spacing from one another so that the gap between two guides strut assemblies can in each case serve to receive a disk-type workpiece. A spacing of the guide strut assemblies from one another (clear distance) of at least double the wafer thickness, but expediently a spacing of 5-30 mm, in particular, has been found to be beneficial. The number of wafers for which the magazines were intended is mainly determined by factors such as heat generated during etching, operational convenience for the staff and size of the bath used.

The spacing struts 8 can be connected to the guide strut assemblies 12 in various ways. Preferably, a connecting technique is chosen in which as few recesses as possible are produced since these disturb the drainage of the liquid working medium. For example, welding, screwing or the use of clamping rivets has proved beneficial.

The folded or bent pattern rather than a linear pattern, which is however not ruled out, has proved beneficial for the shape of the guide struts. In particular, it is expedient simply to kink every strut since perfect drainage of the treatment liquids can then take place. In order to avoid nonuniform wetting of the wafer surface even during the rotation of the magazine, an embodiment is advantageously chosen in which all, or at least the majority of the kinks 14 are at varying distances from the axis of the housing cylinder. In particular, it appears beneficial to use as a main guide strut, a rod which is folded preferably approximately in the center once through 65°-125°, preferably through 90°, and which has a length which corresponds approximately to the diameter of the housing cylinder. The subsidiary guide struts are preferably shorter than the main guide strut, the kink as a rule being arranged off center. The kink angles are preferably greater than 90°, preferably 100°-160°. The main guide struts and subsidiary guide struts should also be connected with as few recesses as possible, the guide strut assemblies preferably being cast in one piece or milled or sawed out of a plate. The linking points 13 of the guide struts with one another will be arranged at varying distances from the center of the cylinder to avoid irregularities in the homogeneous wafer treatment, and, in particular, the struts diverge only in three directions from each linking point 13.

The cross section of the guide struts and spacing struts can be chosen as desired and may be, for example, rectangular, round, oval or square. However, because of the better drainage properties, in particular a rectangular cross section with rounded edges, has proved beneficial, one of the edges in each case pointing toward a wafer surface but two being situated in the plane of the guide strut assembly.

In addition, it is advantageous to construct the guide struts conically since this also promotes the drainage of the liquid medium. In particular, it is expedient to arrange for the converging end of the cone to run toward the linking points 13. In particular 0.1-1.0 times the strut diameter has proved advantageous as the degree of tapering.

Materials which are resistant to the cleaning agents and etchants and do not have a contaminating action on the semiconductor materials used have proved beneficial as the material of the insert and the housing. Plastics such as, in particular, polyfluoroethylene (PFA), polytetrafluoroethylene (PTFE), tetrafluoroethylene-hexafluoropropylene copolymer (FEP), ethylenetetrafluoroethylene copolymer (ETFE), ethylenechlorotrifluoroethylene copolymer (ECTFE), polyvinyl difluoride (PVDF), polychlorotrifluoroethylene (PCTFE) and the like, are therefore preferably used.

Suitable for receiving one or more inserts 5 is, for example, a cylindrical housing 1 whose lateral surfaces are provided after the fashion of a washing machine drum, with a multiplicity of liquid passage openings 2 whose diameter is a fraction of the wafer diameter. Preferably, said openings are circular.

At least one of the end faces of the housing 1 is constructed as a removal lid 3 in order to make it possible to introduce and remove the insert 5. The lid 3 can be plugged or screwed onto the housing cylinder 1, but it is expedient to ensure as few recesses as possible, with the result that a plug connection is beneficial.

In a preferred embodiment, the inner surface of the housing cylinder has a facility for guiding the insert. This may be achieved, for example, by two rails parallel to the housing axis or two studs between which a spacing strut is pushed when introducing the insert. Both end faces advantageously have means 4, such as spindles or gear rims, known to the person skilled in the art and suitable for standard etching systems, for suspending the cylinder in a liquid bath and agitating it, in particular rotating it.

No limits are placed on the choice of liquid, for example a cleaning agent, an oxidizing agent or an etchant, by the application of the invention. Cleaning solutions used are, for example, specially purified water or aqueous solutions of surfactants and other substances used as cleaning agents. Such a cleaning process is described, for example, in DE-A-2 526 052.

Etching solutions used are, for example, mixtures of hydrofluoric and nitric acid, which may also contain additives for the purpose of further controlling the etching process, and also alkaline solutions. In particular, solutions which contain hydrogen peroxide or ozone are also used. For the application of the invention, the usual conditions known to the person skilled in the art such as temperature and pressure ranges and also time duration, under which cleaning, oxidizing and etching processes are carried out, can be maintained.

To use the magazine, the insert is typically loaded with the number of disk-type workpieces determined by the number of guide strut assemblies. The insert is pushed into the housing, which is closed at one end, and the open end face of the housing is sealed with the end face lid. The housing with insert pushed in is attached by means of the holding devices 4 to the conveyor devices of a commercial etching system and introduced into the cleaning or etching bath, which may optionally also be heated or, after sealing, placed under pressure.

A uniform treatment of the substrate surface with the cleaning or etching solution may be achieved, for example, if the mass transfer rates at the solid/liquid phase boundary are as equal as possible over the entire substrate surface, i.e., dissolved particles are removed as quickly as possible from the substrate surface, the used solution is consequently uniformly and quickly replaced by fresh solution and the holding device with which the substrate is introduced into the solution covers as small a part of the surface as possible for as short a time as possible or in a uniform manner, so that no irregularities are produced in the etching process as a result.

The magazine, suspended on the holding device, is therefore preferably completely immersed in the cleaning or etching solution and is agitated in the latter, preferably rotated, in particular with the direction of rotation being altered. In this process, the solution situated in the interior of the housing is continuously replaced by fresh solution from the cleaning or etching bath stock through the passage openings 2. In the interior of the housing, the guide struts ensure a continuous redistribution and thorough stirring of the solution during the agitation of the housing so that uniform flow takes place around the wafers. In addition, the agitation alters the position of the wafers relative to the guide and spacing struts, as a result of which a constant alteration in the points of support of the wafers takes place and, consequently, the exchange of treatment liquid remains constant over the entire wafer surface. Since the linking points of the guide struts are at varying distances from the housing and from the cylinder axis, these points constantly come into contact with different points on the wafer surface during the rotation, as a result of which variable wetting of the wafer, which is shown by experience to result in ring shaped unevenness, is avoided. Since the clear distance between the guide strut assemblies is a multiple of the wafer thickness, the wafers are usually also tilted in the magazine, with the result that only the edge serves as a support surface.

After the specified treatment time, the magazine is lifted out of the batch with aid of the conveyor device.

In this operation, the cleaning or etching solution leaves the housing of the magazine through the passage openings 2. At the same time, the kinks and the preferably conical shape of the guide struts advantageously ensure a better drop formation and a quicker draining of the solution.

The process described can be repeated as often as desired with a very wide variety of cleaning and etching baths without the magazine housing having to be opened.

The advantages of the device according to the invention for holding disk-type workpieces are based on the fact that the support surfaces necessary for holding purposes are not only kept as small as possible and localized at the end of the wafers, but alternate as often as possible during the treatment process, with the result that as large a part as possible of the surface of the semiconductor wafers comes into contact with the solution for a uniformly long time. The contact with the semiconductor material is minimized and distributed over the entire surface by the shape of the guide struts, with the result that no locally varying etching rates occur.

The formation of defects in the flatness and parallelism can be excluded to the greatest possible extent by improving the flow conditions and the mass transfer inside the chambers of the rotatable, cylindrical reaction basket by introducing the specially shaped guide struts. This extends the redistribution of the solution from the zone at the edge of the wafer to the entire volume in the interior of the housing. In addition, the solutions can be constantly replaced from outside the housing during its agitation. The preferably angular and square construction of the guide struts results in an easy drainage of the treatment solutions after removing the magazines from the bath, with the result that nonuniform treatment of the wafers as a result of solution residues left behind is reduced.

The use of the invention in etching semiconductor wafers, in particular silicon wafers, for example in acidic medium with mixtures of oxidic acids and HF containing additives has the result that the deterioration in the geometry of the wafers frequently observed with conventional magazines can be considerably reduced. For example, it was possible to considerably reduce the defects in flatness and parallelism which was previously observed during etching. For example, the total thickness variation (TTV), i.e., the absolute amount of the difference between the maximum and minimum thickness values over the entire wafer surface, which was previously in the range from 5 to 10 μm, improved to less than 1 μm.

The invention has been described above. For the person skilled in the art it is clear that changes and modifications, in particular also of the exemplary embodiment shown in the figures, are possible without thereby departing from the inventive idea.

What is claimed is:

1. A magazine for holding disk-type workpieces for wet-chemical surface treatment in a liquid bath, comprising:
    a housing (1) having openings (2) for passing the liquid bath into and out of said housing (1) and means (4) for introducing said housing (1) into the liquid bath and an insert (5) which is inserted into the housing (1) for holding the work pieces, said insert comprising:
    a) a plurality of guide strut assemblies (12) arranged in parallel and having an outer end facing the housing (1), said guide strut assemblies (12) comprising at least two guide struts (7) being in one plane,
    b) at least three spacing struts (8) operatively connected to the guide strut assemblies (12) at the outer end facing the housing (1) for fixing in said parallel arrangement of the guide strut assemblies (12) so that gaps between the guide strut assemblies (12) permit the reception of the disk-type workpieces, at least one main guide strut (9) connecting two spacing struts (8) and at least one subsidiary guide strut (10) connecting a guide strut (7) to a spacing strut (8) and the majority of the guide struts (7) being folded or bent,
    c) the guide struts (7) diverging at a linking point (13) in no more than three directions,
    d) the linking points (13) of the guide struts (7) not lying on the longitudinal axis of the housing (1),
    e) the diameter of the insert (5) being in the range of 1.1 to 1.9 times the diameter of the work pieces,
    f) the length of the secant to the circumscribing circular arc between at least two of the spacing struts (8) being at least equal to the diameter of the work pieces and the length of the secant to the circumscribing circular arc between at least two of the spacing struts (8) being smaller than the radius of the work pieces, and
    g) the distance between two adjacent guide strut assemblies (12) being at least twice the thickness of the workpiece.

2. The magazine of claim 1 wherein the housing and the insert are manufactured from material which is resistant to the liquid bath.

3. The magazine of claim 1 wherein the housing and the insert are manufactured from material which is selected from the group consisting of tetrafluoroethylene-hexafluoropropylene copolymer, ethylene-tetrafluoroethylene copolymer, ethylenechlorotrifluoroethylene copolymer, polychlorotrifluoroethylene, polyvinylidene difluoride, polyfluoroethylene and polytetrafluoroethylene.

4. The magazine of claim 1 wherein the guide struts and the spacing struts are fixed to one another by welding or screwing.

5. The magazine of claim 1 wherein the guide struts have a square cross-section with rounded edges, at least one of the rounded edges being in the direction of the surface of the work piece.

6. The magazine of claim 1 comprising six spacing struts, one main guide strut and four subsidiary guide struts.

7. The magazine of claim 1 wherein each of the guide struts has a kink having an angle of from 70° to 160°, wherein the kinks are at varying distances from the point where the guide strut is fixed by the spacing strut, the angle of the kink of the main guide strut being greater than 90°.

8. The magazine of claim 1, wherein the kink in the main guide strut (9) is arranged in the center of the guide strut (7).

9. The magazine of claim 1, wherein the linking points (13) of the guide struts are at varying distance from the point where the guide strut (7) is fixed by the relevant spacing strut (8).

10. The magazine of claim 1, wherein the subsidiary guide struts are conically tapered.

11. A method for treating disk-type workpieces with liquid in a liquid bath, whereby said liquid is distributed uniformly, homogeneously and at the same rate over the entire surface of said workpieces, said method comprising:
  a) providing a magazine for holding said disk-type workpieces, said magazine comprising a housing (1) having openings (2) for passing the liquid into and out of said housing (1) and means (4) for introducing said housing (1) into the liquid bath and an insert (5) insertable into the housing (1), said insert comprising a plurality of guide strut assemblies (12) arranged in parallel and having an outer end facing the housing (1), said guide strut assemblies (12) comprising at least two guide struts (7) being in one plane, at least three spacing struts (8) operatively connected to the guide strut assemblies (12) at the outer end facing the housing (1) for fixing in said parallel arrangement of the guide strut assemblies (12) so that gaps between the guide strut assemblies (12) permit the reception of said disk-type workpieces, at least one main guide strut (9) connecting two spacing struts (8) and at least one subsidiary guide strut (10) connecting a guide strut (7) to a spacing strut (8) and the majority of the guide struts (7) being folded or bent, the guide struts (7) diverging at a linking point (13) in no more than three directions, the linking points (13) in no more than three directions, the linking points (13) of the guide struts (7) not lying on the longitudinal axis of the housing (1), the diameter of the insert (5) being in the range of 1.1 to 1.9 times the diameter of the workpieces, the length of the secant to the circumscribing circular arc between at least two of the spacing struts (8) being at least equal to the diameter of the workpieces and the length of the secant to the circumscribing circular arc between at least two of the spacing struts (8) being smaller than the radius of the workpieces, and the distance between two adjacent guide strut assemblies (12) being at least twice the thickness of the workpieces;
  (b) loading the insert (5) with the workpieces;
  (c) inserting the insert (5) into the housing (1); and
  (d) introducing the magazine into the liquid bath.

12. The method of claim 11 wherein said liquid bath is adapted to etch said workpieces.

* * * * *